United States Patent [19]

Kawashima

[11] 3,955,145
[45] May 4, 1976

[54] STATION SELECTOR
[75] Inventor: Kazumi Kawashima, Katano, Japan
[73] Assignee: Matsushita Electric Industrial Company, Ltd., Osaka, Japan
[22] Filed: Oct. 25, 1974
[21] Appl. No.: 518,044

[30] Foreign Application Priority Data
Oct. 31, 1973 Japan.............................. 48-123173
Oct. 31, 1973 Japan.............................. 48-123174
Oct. 31, 1973 Japan.............................. 48-123175
Oct. 31, 1973 Japan.............................. 48-123176

[52] U.S. Cl............................... 325/459; 325/465; 325/468; 334/15
[51] Int. Cl.² ........................ H04B 1/16; H03J 5/00
[58] Field of Search ........... 325/452, 455, 458, 459, 325/464, 465, 468; 334/14, 15

[56] References Cited
UNITED STATES PATENTS

| | | | |
|---|---|---|---|
| 3,737,818 | 6/1973 | Jacob...................................... | 334/11 |
| 3,748,645 | 7/1973 | Kawashima..................... | 340/168 R |
| 3,766,407 | 10/1973 | Hegendorfer....................... | 307/223 |
| 3,778,736 | 12/1973 | Sakamoto............................ | 334/15 |
| 3,810,022 | 5/1974 | Collins.................................. | 325/459 |
| 3,845,393 | 10/1974 | Basset................................... | 325/453 |

Primary Examiner—Robert L. Griffin
Assistant Examiner—Marc E. Bookbinder
Attorney, Agent, or Firm—Stevens, Davis, Miller & Mosher

[57] ABSTRACT

A station selector comprising a first memory for memorizing the first decimal digit of a given channel number in a form of a corresponding binary signal, a second memory for memorizing the second decimal place digit of the channel number in a form of corresponding binary signal, first and second binary-to-decimal converters for converting the contents of the first and second memories into corresponding decimal signals, a matrix circuit for combining the decimal outputs of both the first and second binary-to-decimal converters such that the resultant combination can be taken out from one of the intersections of a matrix corresponding to a given two-digit decimal channel number, and a preset voltage circuit having a plurality of preset channel selection voltage elements adapted to provide respective preset channel selection voltages and selecting one of the voltages for selecting a channel of a corresponding channel number in response to the output taken out from the afore-said intersection, the selected voltage being coupled to a variable reactance element in an electronic tuner section. With this system it is possible to readily preset desired channels.

10 Claims, 11 Drawing Figures

FIG. 8

| INPUT | | | | OUTPUT ON * |
|---|---|---|---|---|
| D | C | B | A | |
| L | L | L | L | "0" |
| L | L | L | H | "1" |
| L | L | H | L | "2" |
| L | L | H | H | "3" |
| L | H | L | L | "4" |
| L | H | L | H | "5" |
| L | H | H | L | "6" |
| L | H | H | H | "7" |
| H | L | L | L | "8" |
| H | L | L | H | "9" |

{ H = HIGH LEVEL
  L = LOW LEVEL
  ※ ALL OF THE OTHER OUTPUTS BEING "OFF"

FIG. 10

| INPUT | | | | OUTPUT ON * |
|---|---|---|---|---|
| D | C | B | A | |
| L | L | L | L | "0" |
| L | L | L | H | "1" |
| L | L | H | L | "2" |
| L | L | H | H | "3" |
| L | H | L | L | "4" |
| L | H | L | H | "5" |
| L | H | H | L | "6" |
| L | H | H | H | "7" |
| H | L | L | L | "8" |
| H | L | L | H | "9" |

{ H = HIGH LEVEL
  L = LOW LEVEL
  ※ ALL OF THE OTHER OUTPUTS BEING "OFF"

STATION SELECTOR

This invention relates to station selectors having an electronic tuner provided with a voltage variable reactance element as a tuning element and effecting the channel selection purely electronically and, more particularly, to an improved station selector which permits one to readily preset a desired channel in reading the number of the channel to be selected.

In electronic tuner type station selectors using a voltage variable reactance element as a tuning element, when it is arranged such that variable resistors for preset channel selection voltages are provided for all channels and the tuner is switched by mechanical switching means of either the manual rotary type or manual pushbutton type, extreme complications of the circuit construction and poor operability at the time of selecting channels are inevitable with an increase of the total number of channels that are to be covered. To alleviate these inconveniences there have been proposed purely electronic systems, in which use is made of binary circuit means such as binary counters or matrix circuits for selecting a desired one of variable resistors for individually corresponding channels. However, all the conventional systems of this type have used a diode matrix based on binary signals and a gate circuit for selecting a matrix output to thereby select a variable resistor corresponding to a desired channel number. Therefore, where variable resistors are preset in correspondence to channel numbers to be selected it is necessary to effect switching of binary signals. This is inconvenient in that the channel number is not readily discernible and that a special switch has to be used. Also, a complicated circuit is required for tuner band switching for each of low and high VHF and UHF bands.

In addition, in the above conventional station selectors memories for memorizing respective digits of a two-digit channel number keyed for selecting the corresponding channel are adapted to operate independently of each other. This means that the keyboard has to be operated twice, that is, it has to be operated such as to specify a two-digit number even in the case of selecting a one-digit number; for instance for selecting the one-digit number of "2" it is necessary to specify both "0" and "2".

An object of the invention is to provide a station selector, which uses a matrix based on decimal signals and permits presetting two-digit channel numbers directly without the need of any special circuit construction.

Another object of the invention is to provide a station selector, which permits easy switching of bands.

A further object of the invention is to provide a station selector of improved operability, permitting selecting of a channel a number of times which is the same as that of the number of figures of the channel number, that is in selecting a channel of a one-digit channel number by designating only one digit and in selecting a channel of a two-digit channel number by designating two digits.

The above and other objects, features and advantages of the invention will become more apparent from the following description taken in conjunction with the accompanying drawings, in which:

FIG. 8 is a table showing the relation between input and output of the channel display circuit drive stage;

FIG. 10 is a table showing the relation between input and output of the binary-to-decimal converter.

Figure 1:
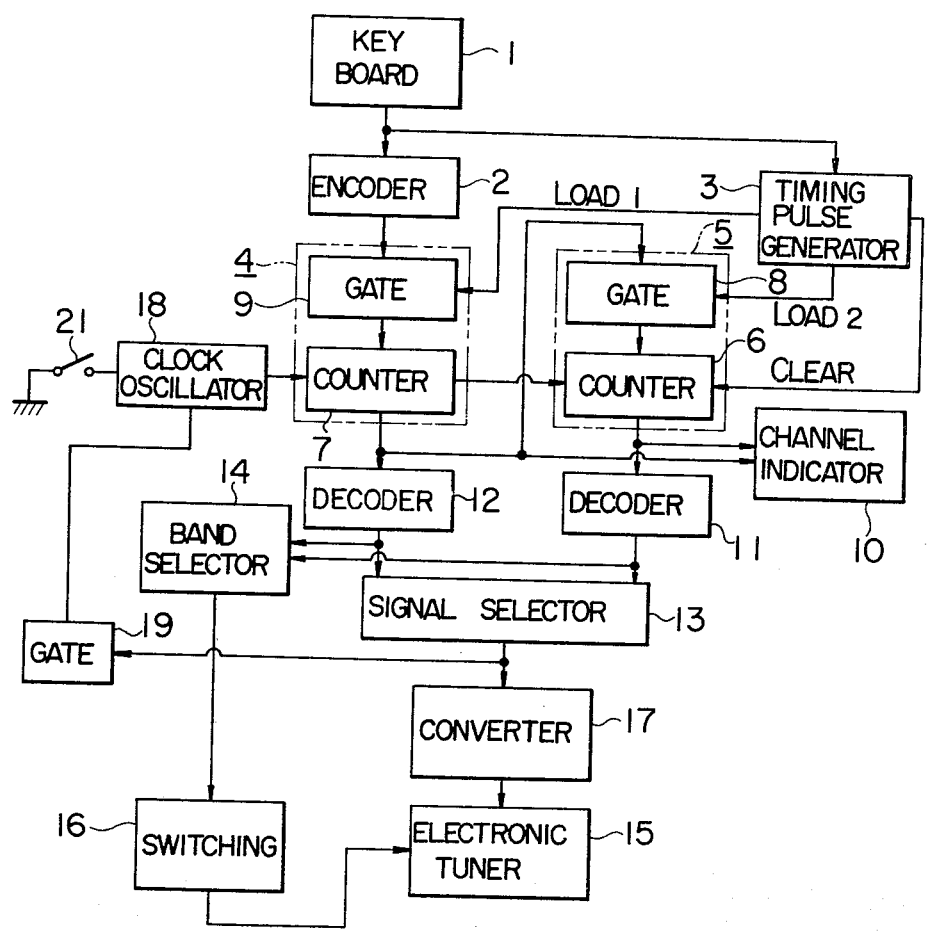
FIG. 1 is a block diagram showing an embodiment of the station selector according to the invention.

Referring now to FIG. 1, which outlines a station selector embodying the invention, there is shown a Keyboard 1 having 10 switches of the normally open type for specifying a desired channel. A decimal output signal of the keyboard 1 is converted into a corresponding binary signal through an encoder 2 for a decimal-to-binary conversion. Meanwhile, when any one of the keys in the keyboard 1 is depressed, a start signal is produced therefrom and added to a timing pulse generator 3, which produces signals for controlling the gating of inputs to presettable counters 4 and 5. The reading of signals in the counters 4 and 5 will be discussed hereinafter. The counter circuit 7 is a first decimal digit counter for the units place, and the counter circuit 6 is a second decimal digit counter for the tens place. When a key in the keyboard 1 is depressed, the timing pulse generator 3 delivers a clear signal to the second decimal digit counter circuit 6, whereupon all the outputs thereof become low level. Simultaneously, a binary signal corresponding to the depressed key is coupled from the encoder 2 to the first decimal digit counter circuit 7, whose content is held unchanged unless a signal subsequently appears from the keyboard 1 within a predetermined period of time. If a signal appears from the keyboard 1 within the aforementioned predetermined period, the content of the counter circuit 7 is read into the counter circuit 6, while a new binary signal of the units place corresponding to the next depressed key is read into the counter circuit 7. The presettable counters 4 and 5 have respective input gates 9 and 8 for performing the reading in as shown above. The input gates are shown included in the respective counters because integrated circuits for this type of presettable counter inclusive of the input gate are commercially available. The outputs of the counters 4 and 5 are coupled to a channel indicator circuit 10, while they are also coupled respectively to decoders 11 and 12 which are binary-to-decimal converters, whose outputs are in turn coupled to both signal selector 13 and band selector 14. The band selector 14 produces a band select signal coupled through a switching circuit 16 to an electronic tuner 15 using a voltage variable reactance element as a tuning element. The output of the signal selector 13 is applied to a digital-to-analog converter 17 for conversion into a corresponding tuning voltage which is to be applied to a voltage variable reactance element in the electronic tuner 15. Thus, the channel designated by keying is selected.

A remote control function enabling the "jumping" over unnecessary channels will now be discussed. Numeral 18 designates a clock oscillator to produce a pulse signal for selecting a channel through jumping. When the reception of an intended channel is detected, a gate 19 controlling the oscillator 18 delivers an oscillation stop command thereto. A remote control switch 21 is closed if it is desired to switch over to another channel, as will be described hereinafter in detail.

Figure 2A:
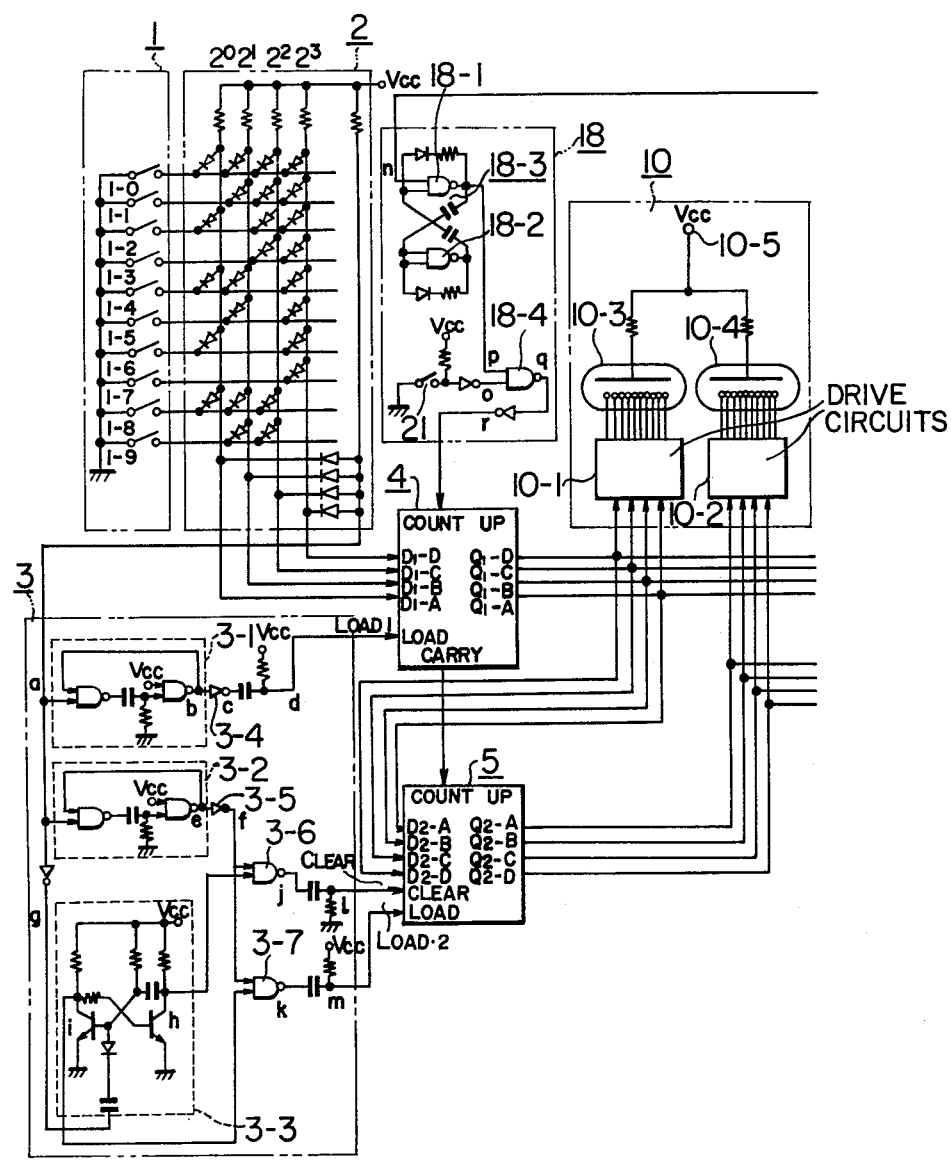
FIGS. 2a and 2b show the detailed circuit construction of the same station selector.
Figure 2B:
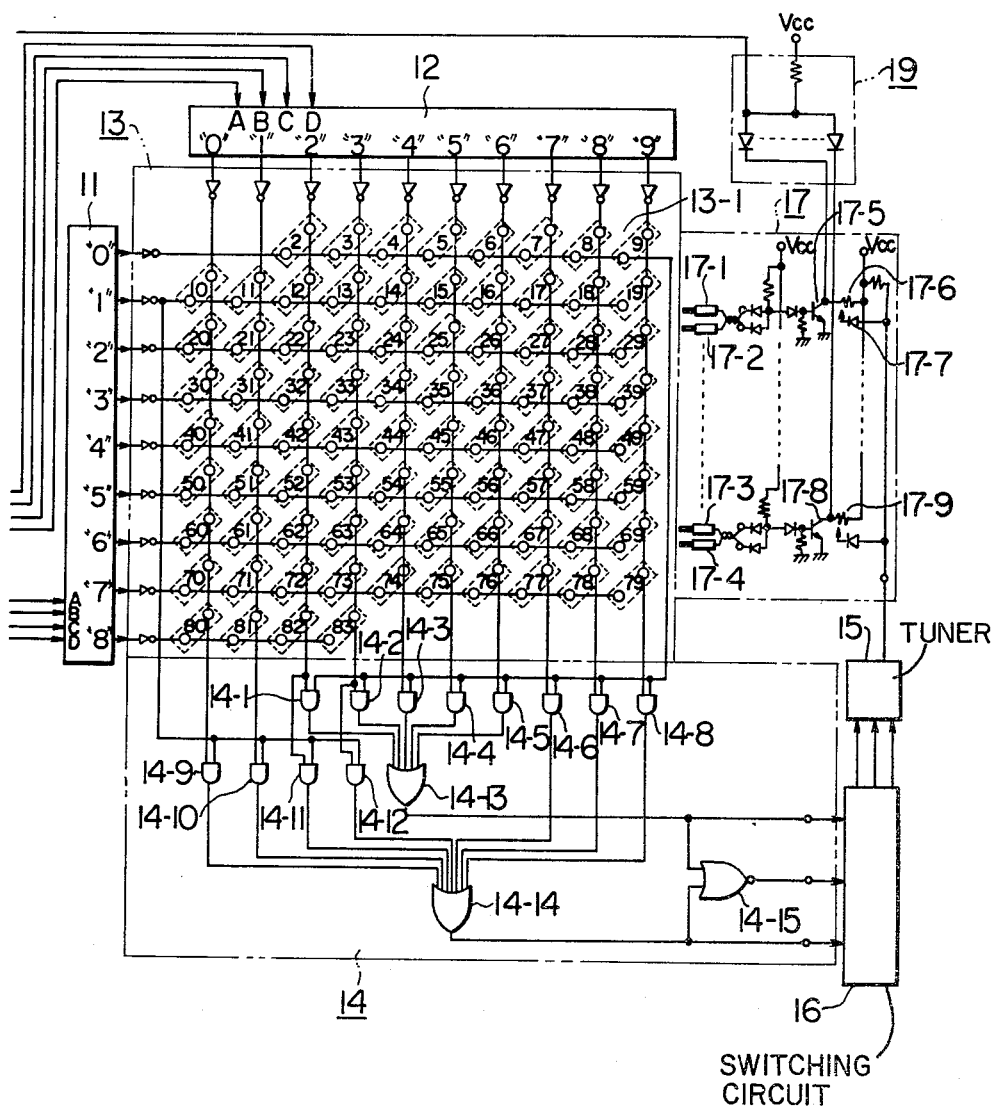
Figure 3:
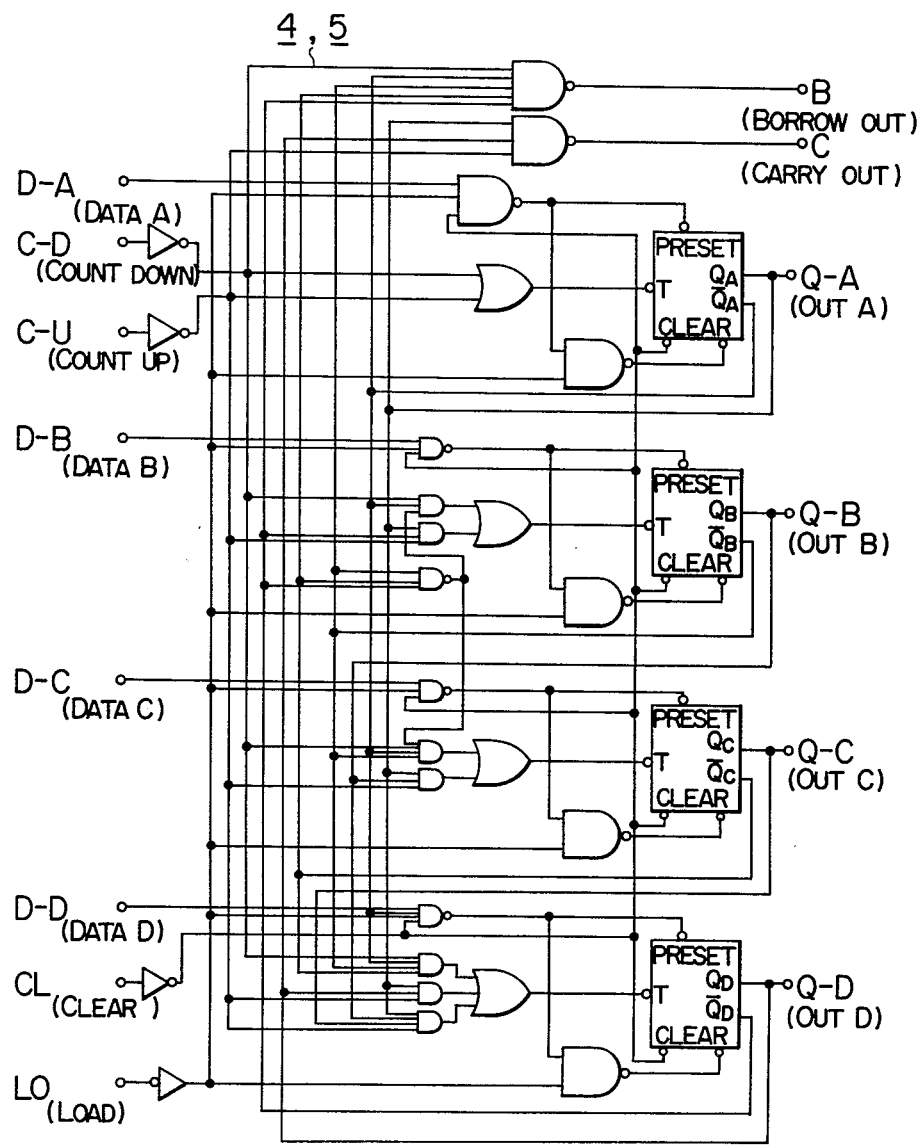
FIG. 3 is a circuit diagram showing a presettable counter used as a memory in the same station selector.
Figure 4:
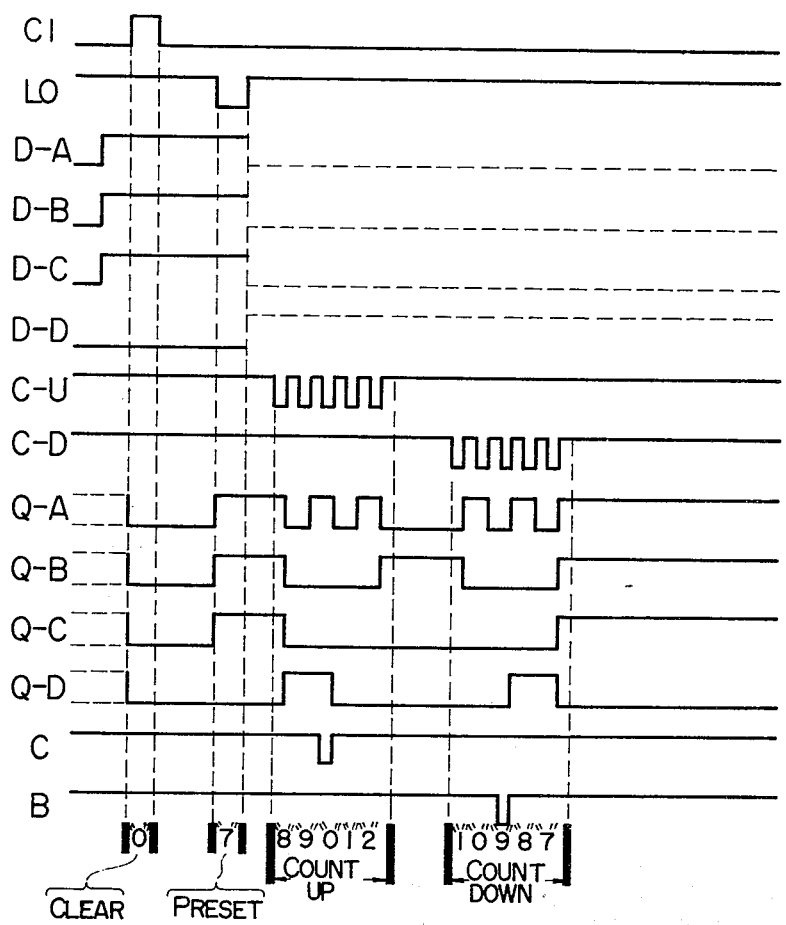
FIG. 4 is a waveform chart illustrating the operation of the presettable counter.

FIG. 2 shows a specific circuit construction of the above station selector. The keyboard 1 has 10 switches 1-0 to 1-9 of the normally open type. The encoder 2 converts the decimal output of the keyboard 1 into a coresonding binary signal. The binary signal outputs of the encoder 2 corresponding to the digit of a depressed one of the keys 1-0 to 1-9 in the keyboard 1 are applied, as binary signal data to input terminal $D_1$-A, $D_1$-B, $D_1$-C and $D_1$-D of the presettable counter 4. The counters 4 and 5 read and memorize their input binary signal when a low-level load signal is applied to their load terminal, but they do not read any signal so long as the load signal to their load signal input terminal is at a high level. Also, the counter 5 is cleared, with all its outputs rendered to be of low level, when a high-level clear signal is applied to its clear terminal. These presettable counters 4 and 5 have a circuit construction as shown in FIG. 3, and their operation is illustrated by the timing chart of FIG. 4. This circuit can be used as an ordinary up-and-down counter with binary signal data applied to its data input terminals D-A to D-D and a low-level count signal applied to its count-up terminal C-U or its count-down terminal C-D. Its output binary signal is taken out from its output terminals Q-A to Q-D. When its binary signal content changes from one representing numeral 9 to one representing numeral 10, a low-level carry signal appears at its carry signal output terminal C. When its binary signal content changes from one representing numeral 0 to one representing numeral 9, a low-level borrow signal appears at its borrow signal output terminal B. These presettable counters 4 and 5 are similar to those which are commercially available, so they are not described in detail, with only the waveforms that occur in their operation shown in FIG. 4.

Figure 5:
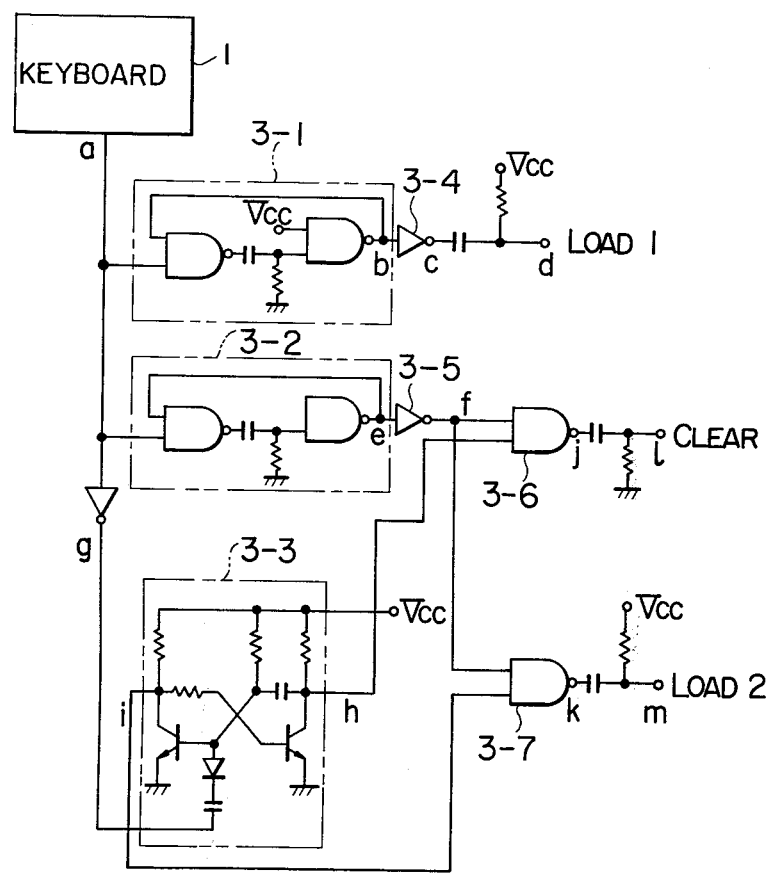
FIG. 5 is a circuit diagram showing a timing pulse generator used in the same station selector.
Figure 6:
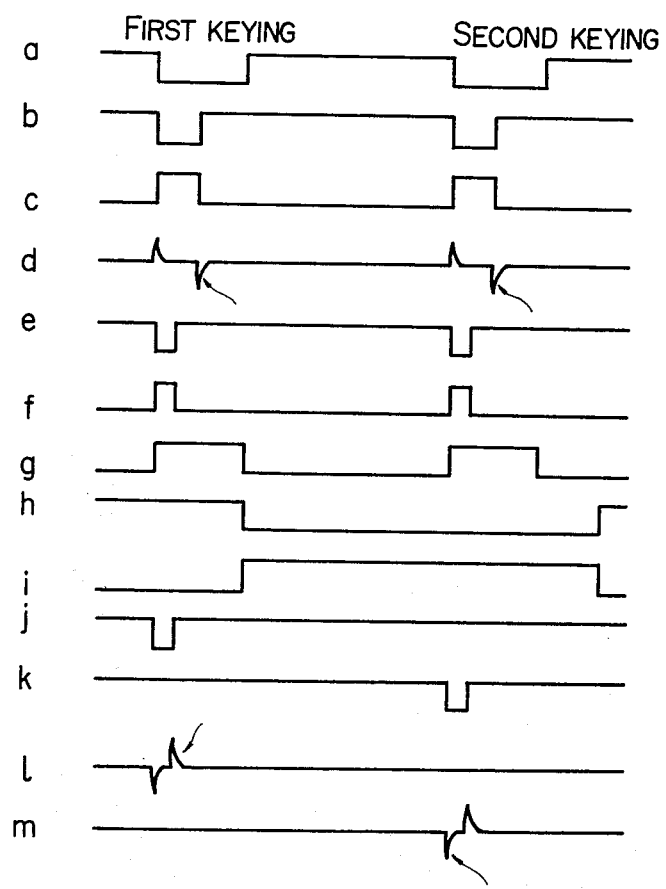
FIG. 6 is a waveform chart illustrating the operation of the timing pulse generator.

The timing signal generator 3 produces a load signal and clear signal delivered to the counters 4 and 5. It has a construction as shown in FIG. 5, and its operation mode is illustrated by the timing chart of FIG. 6. When any one of the key switches 1-0 to 1-9 of the keyboard 1 is closed, the start signal $a$ added to the timing signal generator 3 is inverted to a low level. Three mono-stable multi-vibrators 3-1, 3-2 and 3-3 of different duration periods are triggered in response to the start signal $a$. The pulse length of the output $b$ of the mono-stable multi-vibrator 3-1 is set to be somewhat greater than the output $e$ of the mono-stable multi-vibrator 3-2. The output of the multi-vibrator 3-1 is inverted through an inverter 3-4, whose output is differentiated to obtain a falling pulse signal $d$ to be used as the load signal (Load 1) led to the counter 4.

The output pulse length of the mono-stable multi-vibrator 3-3 is set to be greatest, about 2 to 3 seconds, for discriminating whether the key operation in the keyboard 1 is only once or more than once within this period. A NAND gate 3-6 takes the NAND of the output signal $f$ of the inverter 3-5 inverting the output signal $e$ of the mono-stable multi-vibrator 3-2 and an output signal $h$ of the mono-stable multi-vibrator 3-3, and its output signal $j$ is differentiated to obtain a rising pulse signal $l$ to be used as a clear signal (Clear) led to the counter 5. Another NAND gate 3-7 takes the NAND of the inverter output signal $f$ and the other output signal $i$ of the mono-stable multi-vibrator 3-3, and its output signal $k$ is differentiated to obtain a falling pulse signal $m$ to be used as a load signal (Load 2) led to the counter 5. With this construction, the inputs to the counters 4 and 5 may be changed depending upon whether the keying in the keyboard 1 is made only once or more than once during the operative period of the mono-stable multi-vibrator 3-3.

This aspect will now be discussed in further detail. While a pulse with a duration of 2 to 3 seconds is produced by once keying any one of the key switches 1-0 to 1-9 in the keyboard 1, the counter 5 is reset by the clear signal delivered at the time of the first keying of one of the key switches 1-0 to 1-9, and at this time the keyed-in binary signal is registered in the counter 4 and memorized thereby so long as no further signal is given from any one of the key switches 1-0 to 1-9 of the keyboard 1.

On the other hand, in case if an additional keying of one of key switches 1-0 to 1-9 of the keyboard 1 is made during the operative period of the mono-stable multi-vibrator 3-3 rendered operative by the first keying of any one of the key switches 1-0 to 1-9, though a similar operation holds at the time of the first keying, at the time of the additional or second keying the content of the counter 4 is transferred to the counter 5 in response to the load signal (Load 2) delivered from the NAND gate 3-7, while a new binary signal resulting from the second keying is registered in the counter 4 in response to the load signal (Load 1). This arrangement for discriminating whether or not an additional keying is made within a predetermined period from the first keying in the keyboard 1 (within the operative period of the mono-stable multi-vibrator 3-3) is made for the reasons as follows. With this arrangement, a channel of a single digit channel number can be selected by the single keying, although double keying is required for selecting a channel of a two-digit channel number. For example, for selecting the channel 6 it is necessary to depress only once a key corresponding to the digit 6 rather than depressing a key in key switches 1-0 to 1-9 on the keyboard 1 for the digit 0 and then a key for the digit 6, while for the selection of Channel 12 two keys in key switches 1-0 to 1-9 are depressed, one for the digit 1 first and one for the digit 2 next (within the operative period of the mono-stable multi-vibrator 3-3). In this way, the first keying for the digit 0 when selecting a channel of a single digit channel number can be omitted, so that the operability can be improved.

Figure 7:
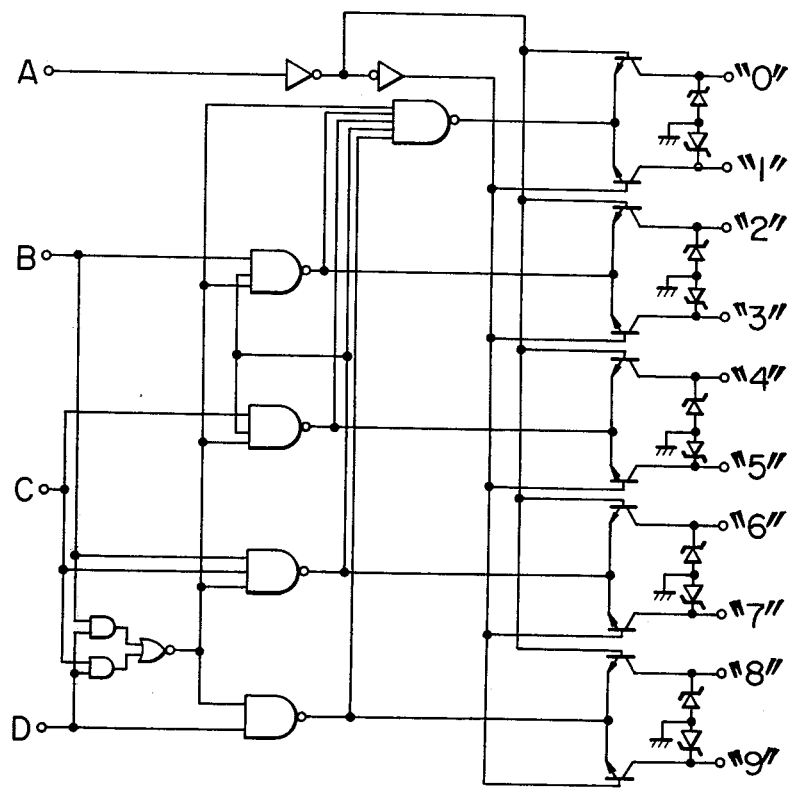
FIG. 7 is a circuit diagram showing a channel display circuit drive stage used in the same station selector.

The binary signal outputs of the counters 4 and 5 are coupled to respective indication drive circuits 10-1 and 10-2 of the channel indicator circuit 10 for conversion into signals for driving respective digit indicator elements 10-3 and 10-4. FIG. 7 shows the construction in detail of the indication drive circuits 10-1 or 10-2 including circuits of decoders and drivers for driving a discharge tube of the digit indicator element 10-3 or 10-4 and the table in FIG. 8 the relation between the input and output of this stage. Designated at A, B, C and D are binary input terminals, and at 0 to 9 decimal output terminals. Designated at 10-5 in FIG. 2$a$ is a power supply terminal, from which the source voltage is supplied to the discharge tubes.

Figure 9:
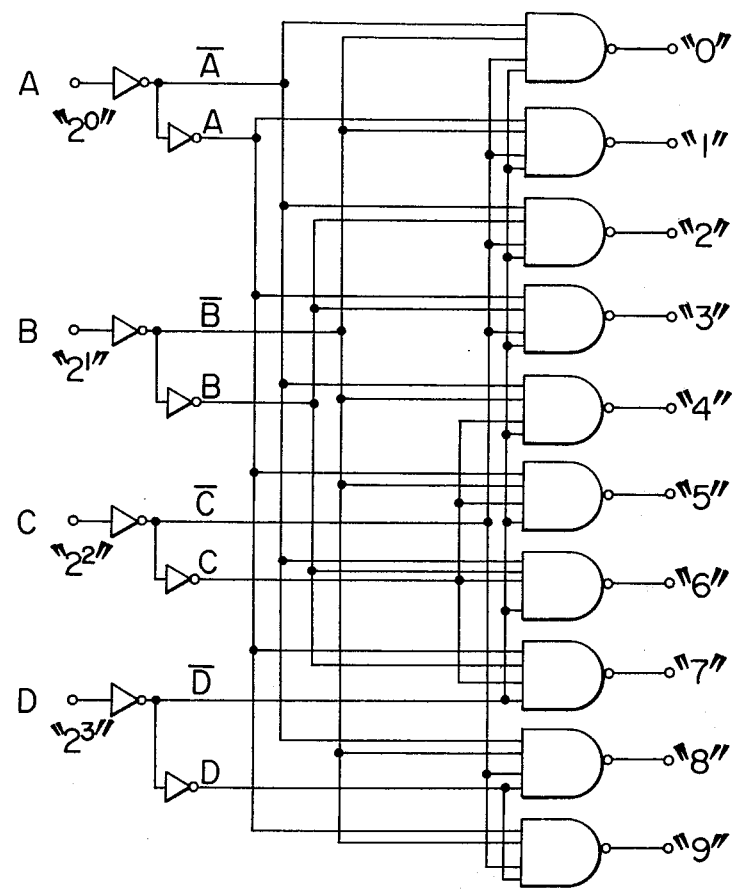
FIG. 9 is a circuit diagram showing a binary-to-decimal converter used in the same station selector.

The binary signal outputs of the counters 4 and 5 are also applied respectively to the decoders 11 and 12 which are binary-to-decimal converters, and are converted into corresponding decimal signals. FIG. 9 shows the circuit construction in detail of the binary-to-decimal converter 11 or 12, and the table in FIG. 10 shows the relation between input and output of this converter. The decimal signal outputs of these converters are applied to the signal selector 13, which comprises a matrix of socket pairs generally designated at 13-1 and respectively labeled 2 to 83, these numerals representing the respective channel numbers. The digital-to-analog converter 17 has a plurality of plugs in pairs 17-1 and 17-2, . . . , and 17-3 and 17-4. These plug pairs are inserted into given socket pairs in the signal selector 13 so that the corresponding channels may be selected. When both outputs corresponding to socket pairs into which pair plugs 17-1 . . . 17-4 are inserted, for instance when outputs corresponding to the socket into which pair plugs 17-1 and 17-2, are inserted become high level, a transistor 17-5 is triggered to cause current through a tuning voltage presettable variable resistor 17-6, so that a tap voltage thereof is coupled as a tuning voltage through a diode 17-7 to a voltage variable reactance element in the tuner 15. The band selector 14 produces a band select signal by setting the AND of the second and first decimal output signals of the binary-to-decimal converter 11 and 12 in AND gates 14-1 to 14-12 and setting the OR of the outputs of these AND gates in OR gates 14-13 to 14-15. Although it is possible to produce a band select signal from binary signals, this causes much more complication both in operation and circuit construction. Accordingly, for electronic band selection it is preferred to synthesize the band select signal from decimal signals as in the above way. The output of the band selector 14 is coupled as a power source through the switching circuit 16 to the tuner 15.

Next, the "jumping" operation by remote control will be discussed. If a channel is tuned in, that is, if one of the transistors 17-5 to 17-8 is "on" and the output thereof is at a low level, the output signal $n$ of the gate 19, which is an OR gate, is at low level, and a gated oscillator 18-3 constituted by NAND gates 18-1 and 18-2 remains inoperative, that is, it is not oscillating. In this state, one input $p$ to a NAND gate 18-4 is at high level. The other input $o$ to the NAND gate 18-4 is at low level so long as the switch 21 is "off". Under this condition, the output $q$ of the NAND gate 18-4 is held at high level, therefore, the count-up command signal input $r$ to the counter 4 is not generated, i.e., it is at a low level. When the switch 21 for selecting the station by remote control is closed under remote control, the input $o$ to the NAND gate 18-4 is inverted to a high level, causing the inversion of the output $q$ of this NAND gate into a low level to cause the inversion of the count-up command signal $r$ to a high level. As a result, the content of the counters 4 and 5 starts to be increased 1 by 1, and the selection of the station is proceeded by augmenting the channel number one by one. The oscillation of the gated oscillator 18-3 continues and the count up is continued until the output of the gate 19 is inverted to a low level when a channel of a preset channel number is selected. In other words, it is when and only when one of the switching transistors 17-5 to 17-8 is inverted to a low level which transistors being for the respective variable resistors 17-6 to 17-9 corresponding to channel numbers which are preset by the pair plugs 17-1 to 17-4 and the socket pairs 13-1 is inverted to low level, that the output of the gate 19 vanishes to stop the oscillation of the gated oscillator 18-3.

As has been shown, the channel selection can be effected easily and quickly by manipulating the keyboard 1, by operating the switch 21 under remote control, or by manually operating the switch 21 for remote control.

It will be appreciated that according to the invention a channel can be selected with the voltage preset element by directly reading a channel number, since it is so arranged that any decimal channel number of two figures may be preset, by combining decimal outputs in a matrix form.

What we claim is:

1. A station selector comprising an electronic tuner having a voltage variable reactance element serving as a tuning element, a plurality of channel selection voltage preset elements for presetting a plurality of voltages for channel selection before selecting the station, which voltages correspond respectively to a plurality of channel numbers, a channel number entry means for separately providing the channel number digit of the units place and of the tens place, a first binary memory for memorizing the digit of the units place of a given channel number in the form of a corresponding binary signal, a second binary memory for memorizing the digit of the tens place of the channel number in the form of a corresponding binary signal, first and second binary-to-decimal converters for converting the binary contents of said respective first and second binary memories into corresponding decimal signals and providing each of said decimal signals on one of a plurality of output lines for each of said converters, a matrix including a grid of intersecting lines coupled to said output lines of said converters for combining the decimal outputs of both said first and second binary-to-decimal converters such that the combination is made available at one of the intersections of said intersecting lines, a means for taking out outputs from intersecting lines of said one of the intersections, which said one intersection corresponds to a channel number of a channel to be selected, and means for selecting one of said channel selection voltage preset elements corresponding to the output of said means for taking out and coupling the channel selection voltage of said selected element to said voltage variable reactance element.

2. The station selector according to claim 1, wherein said means for taking out includes socket means each provided at one of said intersections and said means for selecting includes plug means capable of insertion into desired ones of said socket means.

3. The station selector according to claim 1, in which said channel numbers are divided into groups, each of the groups corresponding to each of a plurality of working bands of said electronic tuner, and said station selector further comprises a gate means to identify to which group a channel number memorized in said first and second memories belongs from the outputs of said first and second binary-to-decimal converters and a band selecting switch means for switching said working bands of the tuner according to the output of said gate means.

4. The station selector according to claim 1, wherein said channel number entry means comprises a keyboard for providing information about the channel number of a channel to be selected to said first and second memories.

5. The station selector according to claim 4, which further comprises means for gating information about a channel number provided from said keyboard upon operation thereof for the first time into said first memory while resetting said second memory at this time, and means for transferring the contents of said first memory to said second memory when and only when said keyboard is operated once again within a predetermined period from the instant of the first keyboard operation while gating channel number information provided due to the second keyboard operation into said first memory.

6. The station selector according to claim 1, in which said first and second memories are constituted by first and second binary counters connected in cascade, and said station selector further comprises a clock pulse generator for producing clock pulses to be counted by said first and second counters to thereby switch channels of successive channel numbers.

7. The station selector according to claim 6, which further comprises means for detecting the output of said selecting means and stopping the clock pulse generation of said clock pulse generator when the output of said selecting means is produced.

8. The station selector according to claim 6, which further comprises means for remotely controlling the clock pulse generation of said clock pulse generator by means of a switch.

9. A station selector comprising an electronic tuner having a voltage variable reactance element serving as a tuning element, a plurality of channel selection voltage preset elements for presetting a plurality of voltages for channel selection before selecting the station, which voltages correspond respectively to a plurality of channel numbers, a keyboard for keying the channel number of a channel to be selected in the form of unit's and ten's digits, a first binary memory for memorizing the digit of the units place of the channel number as a corresponding binary signal, a second binary memory for memorizing the digit of the tens place of the channel number as a corresponding binary signal, means for gating channel number information provided from said keyboard upon operation thereof for the first time into said first memory while resetting said second memory at said first time, means for transferring the contents of said first memory to said second memory when and only when said keyboard is operated once again within a predetermined period from the instant of the first keyboard operation while gating channel number information provided due to the second keyboard operation into said first memory, first and second binary-to-decimal converters for converting the binary contents of said respective first and second binary memories into corresponding decimal signals and providing each of said decimal signals on one of a plurality of output lines for each of said converters, a matrix including a grid of intersecting lines coupled to said output lines of said converters for combining the decimal outputs of both said first and second binary-to-decimal converters, a means for taking out outputs from said intersecting lines of one of the intersections of said matrix, which one intersection corresponds to a channel number of a channel to be selected, means connectable to said taking out means for selecting a predetermined one of said plurality of channel selection voltage preset elements and applying the output of said selected element to said voltage variable element, the channel numbers being divided into groups, each of the groups corresponding to each of a plurality of working bands, a gate means for identifying to which one of the bands the channel number memorized in said first and second memories belongs from the outputs of said first and second binary-to-decimal converters, and a band selecting switch means for switching working bands of the tuner according to the output of said gate means.

10. A station selector comprising an electronic tuner having a voltage variable reactance element serving as a tuning element, a plurality of channel selection voltage preset elements for presetting a plurality of voltages for channel selection before selecting the channel, which voltages correspond respectively to a plurality of channel numbers, channel number entry means for separately providing the channel number digit of the units place and of the tens place, a first binary memory for memorizing the digit of the units place of a given channel number as a corresponding binary signal, a second binary memory for memorizing the digit of the tens place of the channel number as a corresponding binary signal, said first and second memories being respectively first and second binary counters connected in cascade, a clock pulse circuit for supplying clock pulses to said first and second binary counters so as to switch channels to be selected, first and second binary-to-decimal converters for converting the binary outputs of said first and second binary counters into corresponding decimal signals and providing each of said decimal signals on one of a plurality of output lines for each of said converters, a matrix including a grid of intersecting lines coupled to said lines of said converters for combining the decimal outputs of both said first and second binary-to-decimal converters, a means for taking out outputs from said intersecting lines of one of the intersections of said matrix, which one intersection corresponds to a channel number of a channel to be selected, means connectable to said taking out means for selecting a predetermined one of said plurality of channel selection voltage preset elements and applying the output of said selected element to said voltage variable reactance element, the channel numbers being divided into groups, each of the groups corresponding to each of a plurality of working bands, a gate means for identifying to which one of the bands the channel number memorized in said first and second binary counters belongs from the outputs of said first and second binary-to-decimal converters, a band selecting switch means for switching working bands of the tuner according to the output of said gate means, and means for detecting the output of said selecting means and stopping the clock pulse generation of said clock pulse circuit when the output of said selecting means is produced.

* * * * *